United States Patent
Tseng

(10) Patent No.: US 8,969,785 B2
(45) Date of Patent: Mar. 3, 2015

(54) EASILY ASSEMBLED OPTICAL-ELECTRICAL CONVERTING DEVICE HAVING ENGAGED LOCATING ELEMENTS FOR AN OPTICAL COUPLING LENS

(75) Inventor: Kuo-Fong Tseng, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 297 days.

(21) Appl. No.: 13/557,185

(22) Filed: Jul. 24, 2012

(65) Prior Publication Data

US 2013/0313415 A1 Nov. 28, 2013

(30) Foreign Application Priority Data

May 22, 2012 (TW) .............................. 101118110 A

(51) Int. Cl.
*H01J 40/14* (2006.01)
*H01J 5/02* (2006.01)

(52) U.S. Cl.
USPC ............. 250/216; 250/239; 257/433; 385/14; 385/15

(58) Field of Classification Search
USPC ........... 250/216, 227.24, 239; 385/14, 15, 88, 385/93; 359/819; 257/431, 433
See application file for complete search history.

(56) References Cited

U.S. PATENT DOCUMENTS

| | | | | |
|---|---|---|---|---|
| 6,939,058 | B2 * | 9/2005 | Gurevich et al. | 385/93 |
| 2002/0102060 | A1 * | 8/2002 | Jewell et al. | 385/49 |
| 2005/0185882 | A1 * | 8/2005 | Zack et al. | 385/15 |
| 2011/0216998 | A1 * | 9/2011 | Symington et al. | 385/14 |

* cited by examiner

*Primary Examiner* — Francis M Legasse, Jr.
(74) *Attorney, Agent, or Firm* — Novak Druce Connolly Bove + Quigg LLP

(57) ABSTRACT

An optical-electrical converting device includes a printed circuit board (PCB), a light emitting module, a light receiving module, an optical coupling lens, and a locating frame positioned on the PCB. The PCB has two first locating elements. The optical coupling lens includes a first converging lens and a second converging lens. The locating element has two second locating elements. The two first locating elements and the two second locating elements cooperate to position the locating frame on the PCB. The locating element further has two third locating elements. The optical coupling lens has two fourth locating elements. The two third locating elements and the two fourth locating elements cooperate to position the coupling lens on the locating frame, and thus the first converging lens is aligned with the light emitting module, and the second converging lens is aligned with the light receiving module.

6 Claims, 2 Drawing Sheets

EASILY ASSEMBLED OPTICAL-ELECTRICAL CONVERTING DEVICE HAVING ENGAGED LOCATING ELEMENTS FOR AN OPTICAL COUPLING LENS

BACKGROUND

1. Technical Field

The present disclosure relates to an optical-electrical converting device.

2. Description of Related Art

An optical-electrical converting device includes a printed circuit board (PCB), a light emitting module, a light receiving module, and a coupling lens. The light emitting module and the light receiving module are positioned on the PCB. The coupling lens includes a first converting lens for converging light rays from the light emitting module and a second converging lens for converging light rays outwards to the light receiving module; therefore, the first converging lens and the second converging lens need to be aligned with the light emitting module and the light receiving module respectively. Currently, the alignments depend on a cross mark of the PCB, auto-assembly machine assembles the optical coupling lens to the PCB through identifying the cross mark. However, the alignment accuracy and the assembly efficiency of the optical-electrical converting device are low.

Therefore, it is desirable to provide an optical-electrical converting device that can overcome the above-mentioned limitations.

BRIEF DESCRIPTION OF THE DRAWINGS

Many aspects of the embodiments should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
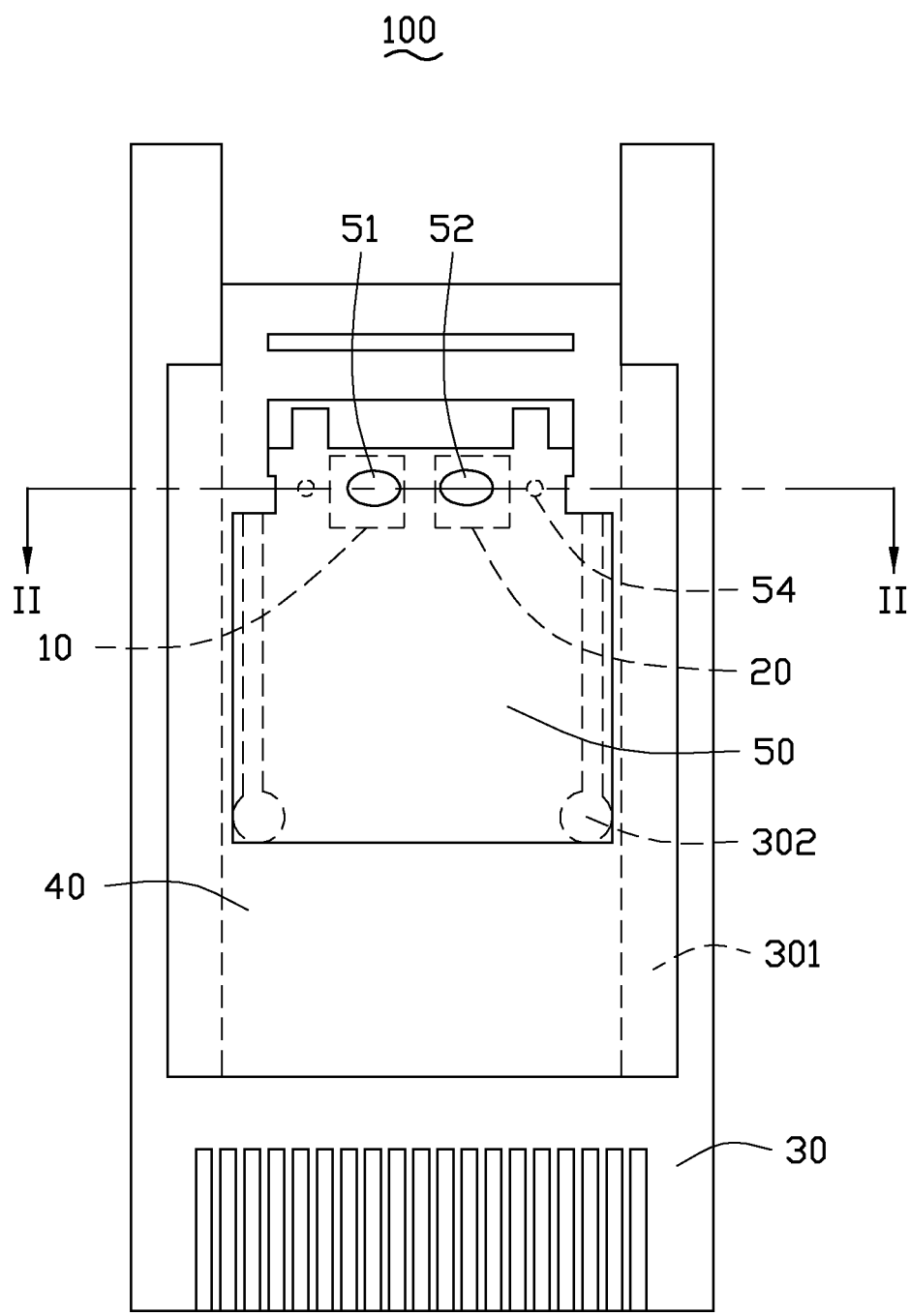
FIG. 1 is a schematic view of an optical-electrical converting device, according to an exemplary embodiment.
Figure 2:
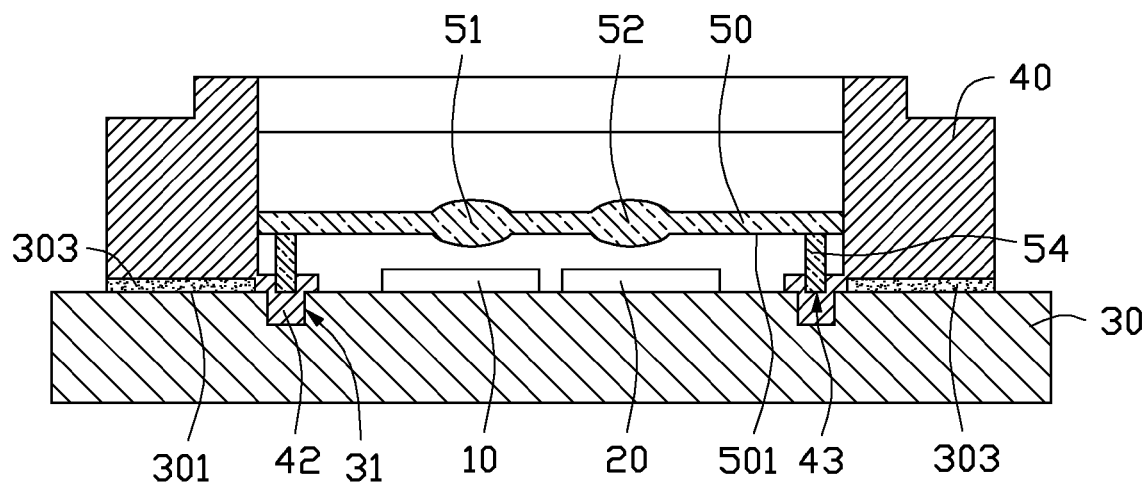
FIG. 2 is a cross-sectional view of the optical-electrical converting device taken along a line II-II of FIG. 1.

FIG. 1 and FIG. 2 illustrate an optical-electrical converting device 100 in accordance to an embodiment. The optical-electrical converting device 100 includes a light emitting module 10, a light receiving module 20, a PCB 30, a locating frame 40, and an optical coupling lens 50.

The light emitting module 10 and the light receiving module 20 are positioned on the PCB 30 and are electrically connected to the PCB 30.

The PCB 30 has two first locating elements 31, two first adhesive areas 301, and two second adhesive areas 302. The two first adhesive areas 301 and the two adhesive areas 302 have glue 303. The numbers of the first adhesive area 301 and the second adhesive area 302 are not limited to this embodiment.

The locating frame 40 is made of plastic material and includes two second locating elements 42 corresponding to the two first locating elements 31. The two second locating elements 42 and the two first locating elements 31 cooperate to position the locating frame 40 on a predetermined position of the PCB 30. The locating frame 40 is fixed on the PCB 30 by the first adhesive areas 301. The locating frame 40 has two third locating elements 43. In this embodiment, the two third locating elements 43 are positioned on the two second locating elements 42 respectively. The position of the third locating element 43 is not limited to this embodiment, and the locating frame 40 also can be made of other materials (such as metal).

The optical coupling lens 50 is positioned on the PCB 30 and includes a first converging lens 51 and a second converging lens 52. The first converging lens 51 is used for converging light rays from the light emitting module 10. The second converging lens 52 is used for converging light rays from outside to the light receiving module 20. The optical coupling lens 50 has a fixing surface 501 facing the PCB 30. Two fourth locating elements 54 are positioned on the fixing surface 501, corresponding to the two third locating elements 43. The two fourth locating elements 54 and the two third locating elements 43 cooperate to position the optical coupling lens 50 on the locating frame 40, and thus the first converging lens 51 is aligned to the light emitting module 10, and the second converging lens 52 is aligned to the light receiving module 20. The optical coupling lens 50 is fixed on the PCB 30 through the second adhesive areas 302.

In this embodiment, both of the first locating elements 31 and the third locating elements 43 are grooves, and both of the second locating elements 42 and the fourth locating elements 54 are stripe-shaped protrusions. And the number of the first locating elements 31, the second locating elements 42, the third locating elements 43, and the fourth locating elements 54 are not limited to this embodiment.

In assembly, the two second locating elements 42 are inserted into the corresponding first locating elements 31 to position the locating frame 40 on the PCB 30. The locating frame 40 is glued on the PCB 30 through the first adhesive areas 301. The two fourth locating elements 54 are inserted into the corresponding third locating elements 43 to position the optical coupling lens 50 on the locating frame 40. The optical coupling lens 50 is glued on the PCB 30 by the second adhesive areas 302.

By employing the locating frame 40, it is easy for the optical coupling lens 50 to be aligned with the light emitting lens 10 and the light receiving lens 20, and thus the product quality and the working efficiency of the optical-electrical converting device 100 can be effectively improved.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. An optical-electrical converting device, comprising:
    a printed circuit board (PCB) having at least two first locating elements;
    a light emitting module positioned on the PCB;
    a light receiving module positioned on the PCB;
    a locating frame comprising:
        at least two second locating elements spatially corresponding to the at least two first locating elements respectively; and
        at least two third locating elements;
    an optical coupling lens positioned on the PCB and comprising:
        a first converging lens optically aligned with the light emitting module;

a second converging lens optically aligned with the light receiving module; and at least two fourth locating elements spatially corresponding to the third locating elements;

wherein each of the at least two first locating elements engages with a respective one of the at least two second locating elements, such that the at least two first locating elements and the at least two second locating elements cooperate to position the locating frame on the PCB; each of the at least two third locating elements engages with a respective one of the at least two fourth locating elements, such that the two third locating elements and the two fourth locating elements cooperate to position the optical coupling lens on the locating frame; and wherein the at least two first locating elements are grooves, the at least two second locating elements and the at least two fourth locating elements are protrusions, and the at least two third locating elements are grooves defined on the at least two second locating elements.

2. The optical-electrical converting device of claim 1, wherein the PCB further comprises at least one first adhesive area, the locating frame is fixed on the PCB by the at least one first adhesive area.

3. The optical-electrical converting device of claim 1, wherein the optical coupling lens has a fixing surface facing the PCB, the at least two fourth locating elements are positioned on the fixing surface.

4. The optical-electrical converting device of claim 1, wherein the locating frame is made of plastic material.

5. The optical-electrical converting device of claim 1, wherein the light emitting module and the light receiving module are electrically connected to the PCB.

6. The optical-electrical converting device of claim 2, wherein the PCB further comprises at least one second adhesive area, the optical coupling lens is fixed on the PCB by the at least one second adhesive area.

* * * * *